United States Patent
Wu et al.

[11] Patent Number: 5,899,738
[45] Date of Patent: May 4, 1999

[54] METHOD FOR MAKING METAL PLUGS IN STACKED VIAS FOR MULTILEVEL INTERCONNECTIONS AND CONTACT OPENINGS WHILE RETAINING THE ALIGNMENT MARKS WITHOUT REQUIRING EXTRA MASKING STEPS

[75] Inventors: Chen Bau Wu, Tu-cherng; Shie-Sen Peng, Hsin Chu, both of Taiwan

[73] Assignee: Taiwan Semiconductor Manufacturing Company, Ltd., Hsin-Chu, Taiwan

[21] Appl. No.: 08/862,793

[22] Filed: May 23, 1997

[51] Int. Cl.[6] .................................................. H01L 21/463
[52] U.S. Cl. .......................... 438/618; 438/685; 438/692
[58] Field of Search .................................... 438/618, 633, 438/685, 692, 14, 13, 691

[56] References Cited

U.S. PATENT DOCUMENTS

| 5,244,534 | 9/1993 | Yu et al. | 156/636 |
| 5,271,798 | 12/1993 | Sandhu et al. | |
| 5,401,691 | 3/1995 | Caldwell | 437/228 |
| 5,434,451 | 7/1995 | Dalal et al. | 257/768 |
| 5,502,008 | 3/1996 | Hayakawa et al. | |
| 5,514,245 | 5/1996 | Doan et al. | 156/636.1 |
| 5,705,320 | 1/1998 | Hsu et al. | |
| 5,747,382 | 5/1998 | Huang et al. | |

*Primary Examiner*—Caridad Everhart
*Attorney, Agent, or Firm*—George O. Saile; Stephen B. Ackerman

[57] ABSTRACT

A method for making stacked metal plugs in via holes and contacts was achieved, while retaining alignment marks without using additional masking steps. The method involves the deposition of a barrier layer and a tungsten layer, which fill the via holes or contact openings in an insulating layer. The tungsten is then etched back, without overetching, to the surface of the barrier layer to form tungsten plugs that are coplanar with the surface of the insulating layer. Concurrently the tungsten is removed from the recessed alignment marks, which allows for the replication of the alignment marks in the next level of metal, thereby eliminating additional masking steps. The residual tungsten left on the surface after etch-back is removed by a short chemical/mechanical polishing to eliminate defects. The etch-back also removes the tungsten from the beveled edge of the substrate that can cause peeling and additional defects. The method can be repeated several times to form additional levels of interconnecting metal having stacked vias.

17 Claims, 8 Drawing Sheets

METHOD FOR MAKING METAL PLUGS IN STACKED VIAS FOR MULTILEVEL INTERCONNECTIONS AND CONTACT OPENINGS WHILE RETAINING THE ALIGNMENT MARKS WITHOUT REQUIRING EXTRA MASKING STEPS

BACKGROUND OF THE INVENTION (1) Field of the Invention

The present invention relates to a method for making metal plugs in via holes for multilevel inter-connections, and more particularly relates to a method for making buried metal plugs for stacked vias for integrated circuits on semiconductor substrates without destroying the mask alignment marks in the kerf area (the area between chips on the substrate) and without requiring additional masking steps.

(2) Description of the Prior Art

The packing density of devices on integrated circuits has dramatically increased on ultra-large scale integrated (ULSI) circuits due to advances in semiconductor processing, such as the use of high-resolution photolithography and anisotropic plasma etching. In this sub-micron technology the packing density of devices on integrated circuits is strongly dependent on the metal interconnection density. Therefore, the design rules are more aggressively scaled, and in addition more levels of metal are added to effectively interconnect the high density of discrete devices on the chip.

One method of achieving these high-density metal interconnections is to form stacked vias between the various levels of metal interconnections. In addition, because of the high photoresist resolution, it is necessary to form a planar surface due to the need to use a shallower depth of focus (DOF) when exposing the photoresist. This has necessitated the use of metal plugs in the contact openings to devices on the semiconductor substrate, and to the use of metal plugs in via holes between various levels of metal interconnections to replace the non-filled via holes used in the past, in which the top metal layer conformally fills the via holes resulting in a non-planar structure. Also it is more difficult to achieve good step coverage in the smaller via holes having high aspect ratios.

The metal plugs in via holes are formed by conformally depositing a metal, such as tungsten (W), that completely fills the via holes. The tungsten is then etched back or chemical/mechanically polished (CMP) back to the surface of an insulating layer that has the via holes between the patterned metal levels, or to the insulating layer in which the contact openings are formed over the devices on the substrate.

Figure 1:
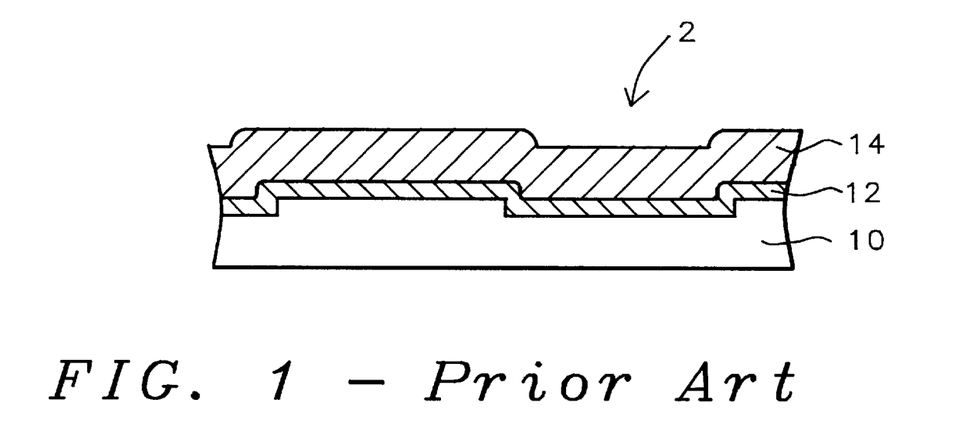
FIGS. 1 through 3 are schematic cross-sectional views for the prior art through the alignment mark in the kerf area depicting the sequence of steps that result in the vanishing alignment marks when chemical/mechanical polishing is used.
Figure 2:
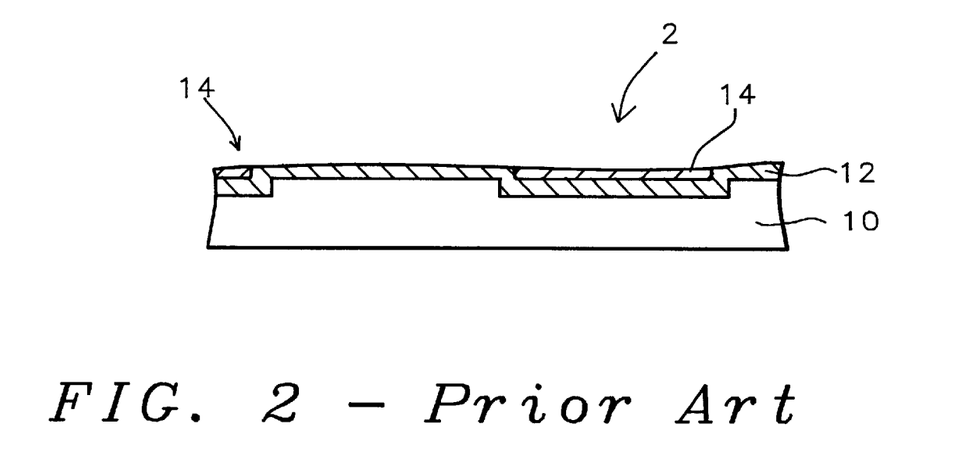
Figure 3:
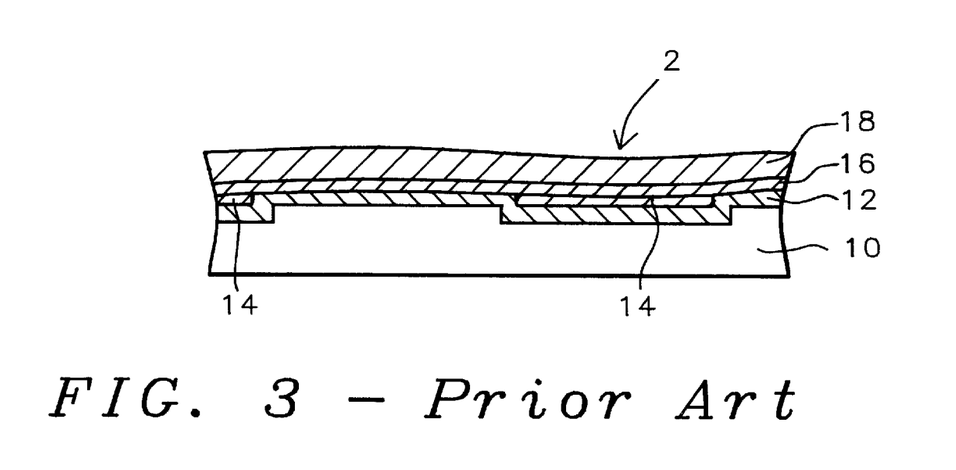
Figure 4:
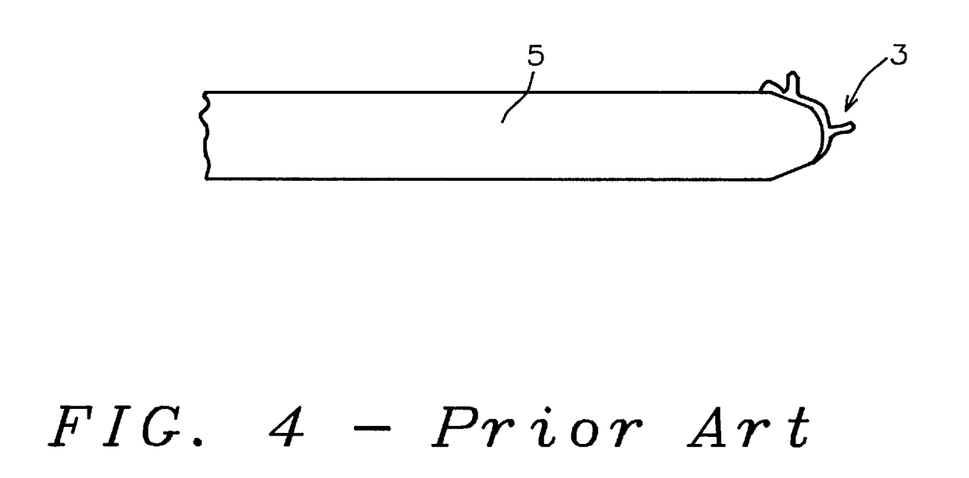
FIG. 4 is a prior-art schematic cross-sectional view of a substrate depicting the tungsten residue that can peel when the tungsten is chem/mech polished back to form the metal plug vias.

Unfortunately, there are several problems associated with completely etching back or chem/mech polishing back the tungsten to the insulating surface. For example, when the tungsten (W) layer is chem/mech polished back to globally planarize the surface of the substrate, the alignment marks are filled with tungsten in the kerf areas. When the next level of metal is deposited, the alignment marks in the kerf areas are no longer visible during the subsequent alignment of the reticle (mask) used during the exposure of the photoresist in the step-and-repeat tool for patterning the next level of metal. This problem is depicted in FIGS. 1–3. FIG. 1 shows the alignment mark 2 in one of the kerf areas on a substrate having an insulating layer 10, with a first titanium/titanium nitride (Ti/TiN) barrier layer 12, and a tungsten layer 14. FIG. 2 shows the kerf area filled with tungsten 14 after chem/mech polishing back. Now as shown in FIG. 3, when the next level of metal (e.g., AlCu) is deposited, the surface is essentially planar and the alignment mark 2 is undetectable, and the next photomask level cannot be aligned for patterning the next level of metal interconnections. Another problem with CMP is depicted in FIG. 4. When the tungsten is polished back, residual tungsten 3 remaining on the beveled edges of the wafer (substrate) 5 can peel and result in contamination that can cause defects on the chips during subsequent processing.

Figure 5:
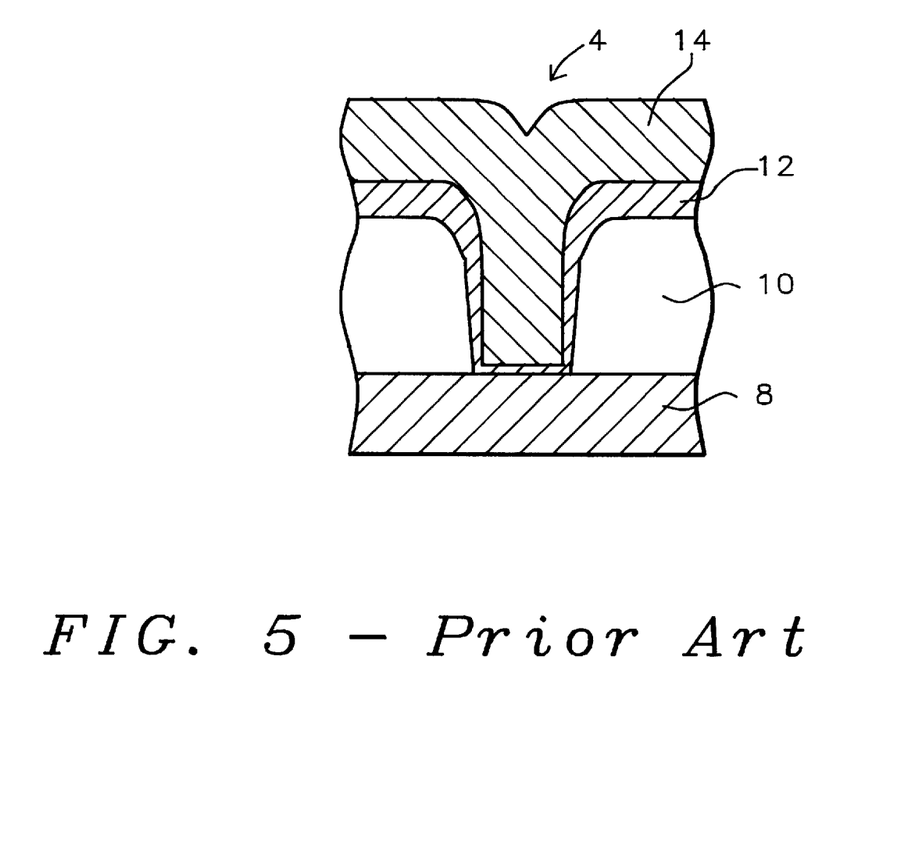
FIGS. 5–7 are prior-art schematic cross-sectional view showing the sequence of steps for making a tungsten plug in an insulator between two conductive metal layers when an etch-back is used to form the plug.
Figure 6:
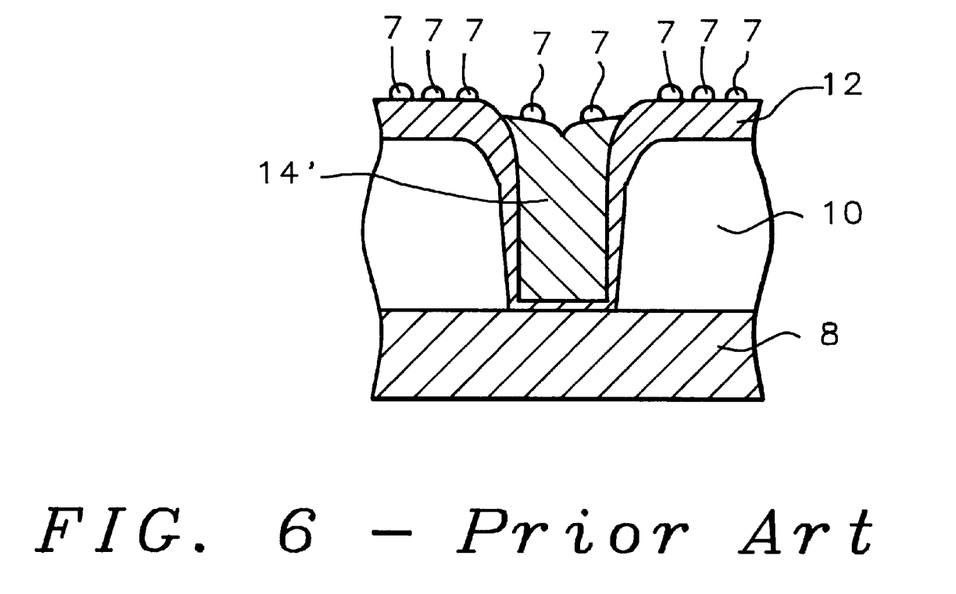
Figure 7:
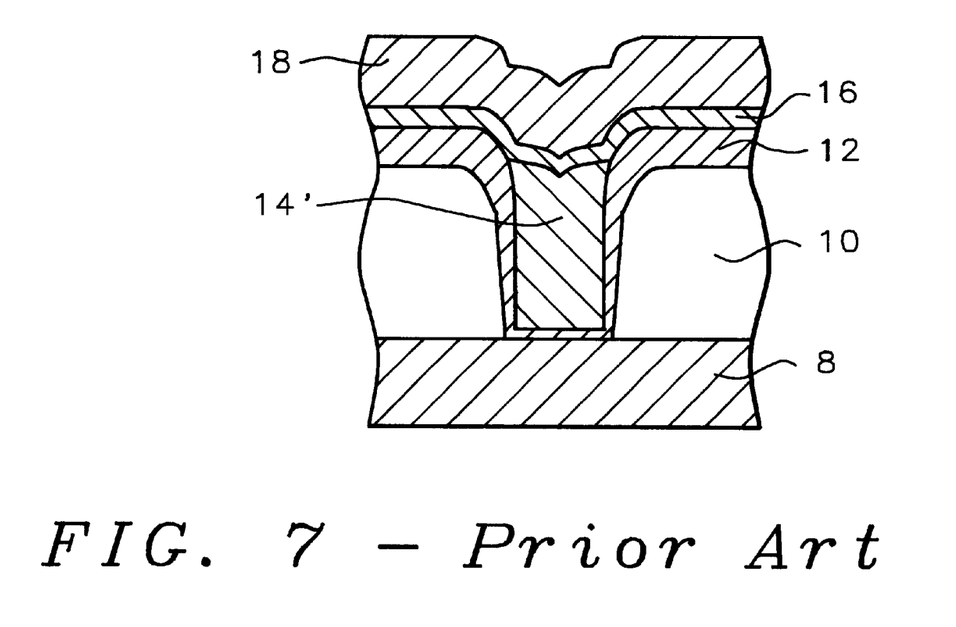

Alternatively, to avoid the CMP problems, a plasma etch-back process can be used to etch back the tungsten to form the metal plugs in the via holes, while providing visible alignment marks in the kerf area. However, this can also result in several undesirable effects, as depicted in FIGS. 5–7. A typical via hole 4 etched in the insulating layer 10 is shown in FIG. 5 having the Ti/TiN first barrier layer 12, and filled with tungsten 14, making contact to the underlying conducting layer 8, such as one of the levels of interconnecting metallurgy, or in the case of forming the contact to the devices on the substrate, to one of the electrically conductively doped polysilicon layers. When the tungsten is etched back to the Ti/TiN surface 12, as shown in FIG. 6, the rough topography of the tungsten layer 14 can result in a rough surface 7 on the Ti/TiN barrier layer and also leaves identical tungsten residue 7 on the plug 14', and on the surface of the Ti/TiN if a tungsten overetch is not used. The residual tungsten is undesirable and can cause defects. Typically the overetch, as shown in FIG. 7, also results in undesirable recessing of the plug 14' in the via hole or contact opening, and results in a non-planar surface for the next level of metal 18, which includes a second barrier layer 16, over the metal plug 14' in the via hole 4. This can make it difficult to form plug contacts to the substrate as well as stacked vias over the contact structures.

Various methods for making metal contact plugs (studs) on integrated circuits have been reported. Dalal et al. U.S. Pat. No. 5,434,451, describe a method using a tungsten liner process for simultaneously forming contact studs and interconnect lines. Another method that teaches the formation of metal plugs and/or wiring metal layers is described by Hayakawa et al. in U.S. Pat. No. 5,502,008. Their method uses a chemical/mechanical polish (CMP) to flatten the metal plugs prior to etching. Still another method is described by Doan et al., U.S. Pat. No. 5,514,245, utilizing two CMPs, one with a low compressibility, and one with a soft compressible pad to remove microscratches. Another method that uses a two-step CMP is described in U.S. Pat. No. 5,244,534. Another method for removing dielectric layers from over an alignment mark is described by Caldwell in U.S. Pat. No. 5,401,691.

There is still a need in the semiconductor industry to provide an improved process for making metal plugs for stacked via hole over contact openings which do not requiring extra masking steps to expose the alignment marks for aligning. And still a need to provide a contamination-free process that provides a planar structure.

SUMMARY OF THE INVENTION

It is therefore a principal object of this invention to provide an improved method for making metal plugs in contact openings to semiconductor devices, and for metal plugs in via holes between multilevel metal interconnections that minimizes the tungsten plug recess and ensures the feasibility of making stacked vias with improved electromigration properties.

It is another object of this invention to provide a method for forming a planar surface having metal plugs using primarily a plasma etch-back, followed by a short chem/mech polishing which preserves the alignment marks in the kerf area of the substrate, and therefore does not require an additional masking step.

Still another object of this invention is to perform a short chem/mech polishing step after etch back to remove surface roughness and residue to minimize defects, while the tungsten etch-back removes tungsten metal at the beveled edge of the wafer that can peel and contaminate the substrate.

The method for making the metal plugs for electrical interconnections, such as in via holes (openings) through an insulating layer between patterned conducting layers, is described. The method retains alignment marks in the kerf area so that the masking for the next level of metal can be properly aligned to the openings. Although the method is described for making the metal plugs for the multilevel interconnections, it should be understood that the method can be equally applied to making metal plugs in contact openings to the substrate and to patterned polysilicon layers that form portions of devices, such as field effect transistors (FETs), bit lines, and the like.

The multilevel metal structure is formed on a semiconductor substrate having semiconductor devices. After providing electrical contacts to the substrate, such as metal plugs, a first conducting layer, such as aluminum/copper (Al/Cu) alloy, is deposited and patterned to form a first metal level of interconnections. An insulating layer is deposited and planarized over the patterned first conducting layer. Openings, commonly referred to as via holes, are etched in the insulating layer to the patterned first conducting layer. The insulating layer also has recessed areas, which are used as alignment marks in the kerf areas on the substrate. Typically the alignment marks are formed in the area between the chips of an array of chips on the substrate that are used by a step-and-repeat tool to align and expose the photoresist for patterning the various layers. Typically the alignment marks are recessed areas and are considerably wider than the via holes. A first barrier layer, such as titanium/titanium nitride (Ti/TiN), is conformally deposited on the insulating layer, and also in the via holes and in the kerf areas. Next, a refractory metal layer, such as tungsten, for making metal plugs is conformally deposited over the barrier layer to fill the via holes. The tungsten metal, however, remains conformal over the wider alignment marks in the kerf areas. By the method of this invention, the tungsten metal layer is etched back to the surface of the insulating layer without overetching. This removes the metal in the alignment marks, and retains the alignment marks, while the top surface of the tungsten metal in the via holes remains, and is essentially planar with the insulating layer. The etch-back also removes the tungsten on the beveled edge of the substrate, which would otherwise remain when only a chemical/mechanical polish-back is used. Typically in the prior art that uses an etch-back, an excessive overetch is used to remove the residual tungsten particles (resulting from the rough tungsten) on the substrate, which can excessively recess the tungsten plug in the via hole, making it difficult to form stacked vias. By the method of this invention, a short CMP step is used after etch-back to remove the tungsten residue, to provide a smooth surface, and to prevent recessing of the tungsten plugs. The TiN serves as a good etch-stop for the CMP of the remaining tungsten. The method for completing the plug via hole structure to the next level of metal (M2) is achieved by depositing a conformal second barrier layer, composed of a Ti/TiN layer, and a conformal second conducting layer, such as AlCu, which is patterned by conventional photolithographic means and plasma etching using the alignment marks to align and expose the photoresist.

The method does not require additional masking steps to expose the alignment marks since the recessed areas for the alignment marks are retained and are replicated in the conformal second metal (M2), allowing for alignment of the mask for etching the M2 metal.

The method eliminates the peeling of tungsten at the beveled edge of the substrate that typically occurs with a CMP process, and prevents recessing or dishing of the tungsten plug caused by a single etch-back process. The method can be repeated to form additional levels of interconnections to complete the wiring on ULSI circuits.

BRIEF DESCRIPTION OF THE DRAWINGS

The objects and other advantages of this invention are best understood with reference to the preferred embodiment when read in conjunction with the following drawings.

FIGS. 8A–11A are schematic cross-sectional views showing the sequence of process steps, by the method of this invention, for making the improved via plug structures.

FIGS. 8B–11B are schematic cross-sectional views through the alignment mark for the sequence of process steps in FIGS. 8A–11A, in which the process retains the alignment mark for the next level of metal interconnections.

DESCRIPTION OF THE PREFERRED EMBODIMENT

The present invention relates to a method for forming metal plugs for electrical interconnections, and which is also applicable for making metal plug contacts to semiconductor devices, such as field effect transistors (FETs) having polysilicon gate electrodes and source/drain contacts, and similar devices on semiconductor substrates. Although the method is described for a metal plug via in a single insulating layer between two patterned electrical conductive layers to simplify the discussion and drawings, it should be well understood by those skilled in the art that the method can be used to make multilevel inter-connections, and more specifically for making stacked metal plug via structures to increase the wiring density on the integrated circuits. The method can also be used to form the metal plug contact structures and therefore can form stacked plug vias over plug contacts to increase wiring density.

The method utilizes a single etch-back step and a short chem/mech polishing step to form the metal plugs coplanar with the insulating layer while retaining the alignment marks in the kerf areas between chips on the substrate. This eliminates the need for an extra masking step to expose the alignment marks. The method also provides a smoother surface free of metal residue which reduces defects and increases yield.

Referring now to FIGS. 8A through 11B, greatly enlarged schematic cross-sectional views are shown of a single plug via structure depicting the sequence of processing steps for this invention. The via plug structures are typically formed on a semiconductor substrate having partially completed semiconductor circuits. Preferably the substrate is a single-crystal silicon substrate, but is not depicted in the Figs.

Figure 8A:
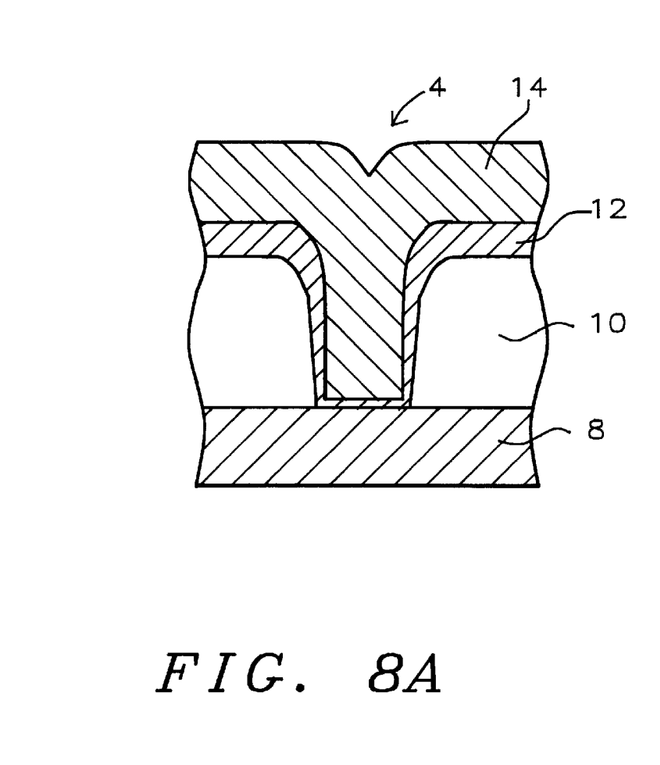

Referring to FIG. 8A, the method of this invention starts by forming a first conducting layer 8 on the partially completed integrated circuit on the substrate. Layer 8 is preferably composed of a metal such as aluminum/copper (AlCu) alloy and is deposited by physical vapor deposition. For example, sputter deposition can be used to deposit the AlCu to a preferred thickness of between about 2000 and 8000 Angstroms. The first conductive layer 8 is then patterned, for example, by using conventional photolithographic techniques and anisotropic plasma etching to provide an interconnecting metal for the devices on the substrate. The etching can be carried out, for example, in a reactive ion etcher (RIE) using a gas mixture containing chlorine ($Cl_2$). The first conductive layer 8 can represent any conductive level of metal in a multilevel interconnect structure, but is depicted as the first metal level (M1). Alternatively, layer 8 can represent other conducting layers such as doped polysilicon to which plug contacts can be made, or can represent diffused contact regions on and in a substrate. Continuing with the process and still referring to FIG. 8A, an insulating layer 10, commonly referred to as the intermetal oxide (IMO) or intermetal dielectric (IMD), is deposited over the patterned conductive layer 8. Preferably layer 10 is composed of silicon oxide ($SiO_2$) and is deposited by low pressure chemical vapor deposition (LPCVD) using, for example, as the reactant gases tetraethosiloxane (TEOS) and oxygen ($O_2$). The thickness of layer 10 is determined by the level of integration, but is preferably deposited to a thickness of between about 5000 and 20000 Angstroms. The insulating layer 10 is planarized over the patterned first conducting layer 8. For example, insulating layer 10 can be planarized by chemical/mechanical polishing (CMP).

Figure 8B:
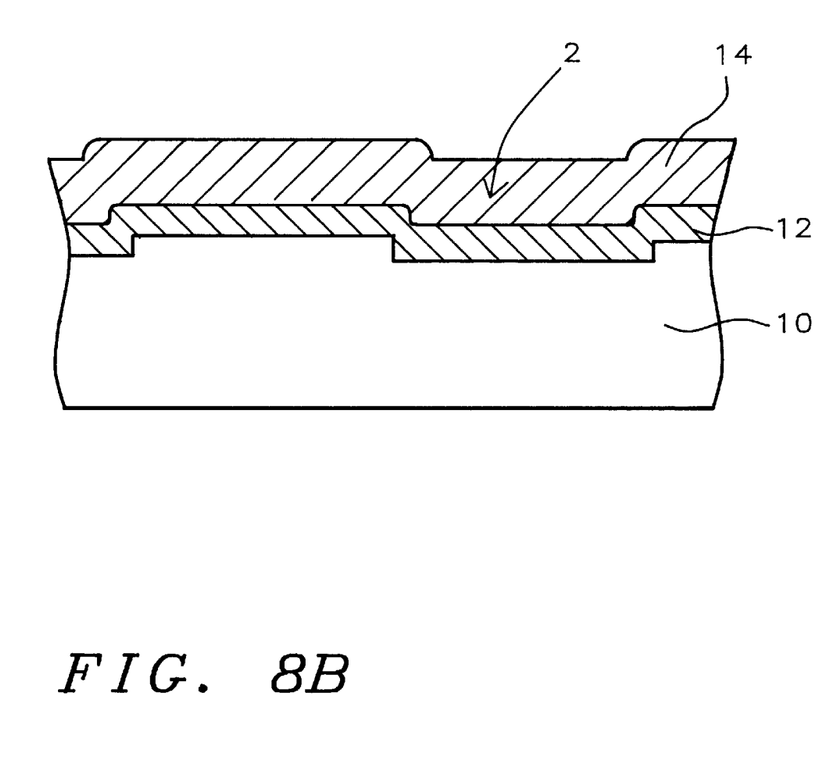

Referring still to FIG. 8A, openings 4, commonly referred to as via holes, are etched in the insulating layer 10 to the underlying patterned first conductive layer 8, and concurrently, alignment marks 2 are formed, as shown in FIG. 8B. The openings are etched preferably by using conventional photolithographic techniques and anisotropic plasma etching. For example, the openings 4 can be etched using high-density plasma (HDP) etching, or reactive ion etching using an etchant gas, such as trifluoromethane ($CHF_3$), which etches the $SiO_2$ selectively to the underlying conductive layer 8. Next, a first barrier layer 12, also referred to as a glue layer, is conformally deposited over the insulating layer 10 and in the contact opening 4. Layer 12 is preferably a titanium/titanium nitride layer, and is formed by first depositing a titanium (Ti) layer having a thickness of between about 0 and 1000 Angstroms. The Ti is deposited using sputter deposition. The titanium nitride (TiN) is deposited next. The thickness of the TiN layer is preferably between about 0 and 2000 Angstroms. The TiN can be deposited by sputter deposition, collimated sputtering, or by chemical vapor deposition (CVD).

Still referring to FIG. 8A, a conformal metal layer 14, preferably tungsten (W), is deposited over the first barrier layer 12, and in the via hole 4. Preferably tungsten is deposited by CVD, using tungsten hexafluoride ($WF_6$) as the reactant gas. Layer 14 is deposited to a thickness equal to at least one-half of the maximum width of the opening 4 in order to completely fill the opening. By way of example only, if the width of the via opening 4 is between 0.2 and 1.0 micrometers (um), the W is deposited to a thickness of between about 1000 and 10000 Angstroms. Concurrently, the sequence of processing steps in FIG. 8A are also depicted in FIG. 8B over the areas between the chips.

Referring to FIG. 8B, a cross section is shown through the insulating layer 10 in the kerf area after the same processing steps that are carried out and described with reference to FIG. 8A. The kerf area, which is the area between chips, shows a recessed area 2, which serves as the alignment mark in the insulating layer 10. FIG. 8B also shows the conformal deposition of the Ti/TiN layer 12 and the conformal overlying metal layer 14, composed of tungsten (W). In the prior art, the W layer 14 is typically polished back, as shown in FIG. 2, resulting in tungsten filling the recessed area 2 (alignment mark) forming an essentially planar surface that makes it difficult to align the photoresist mask for etching the next level of metal inter-connections.

Figure 9A:
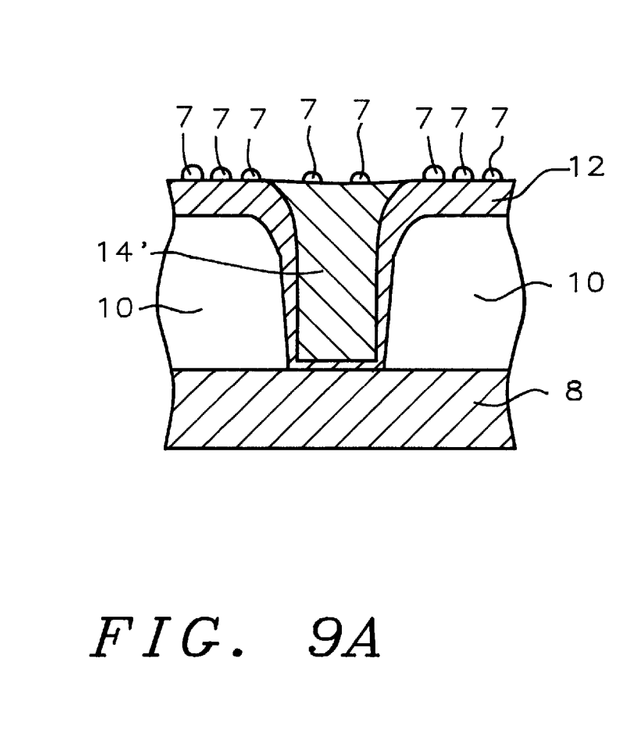
Figure 9B:
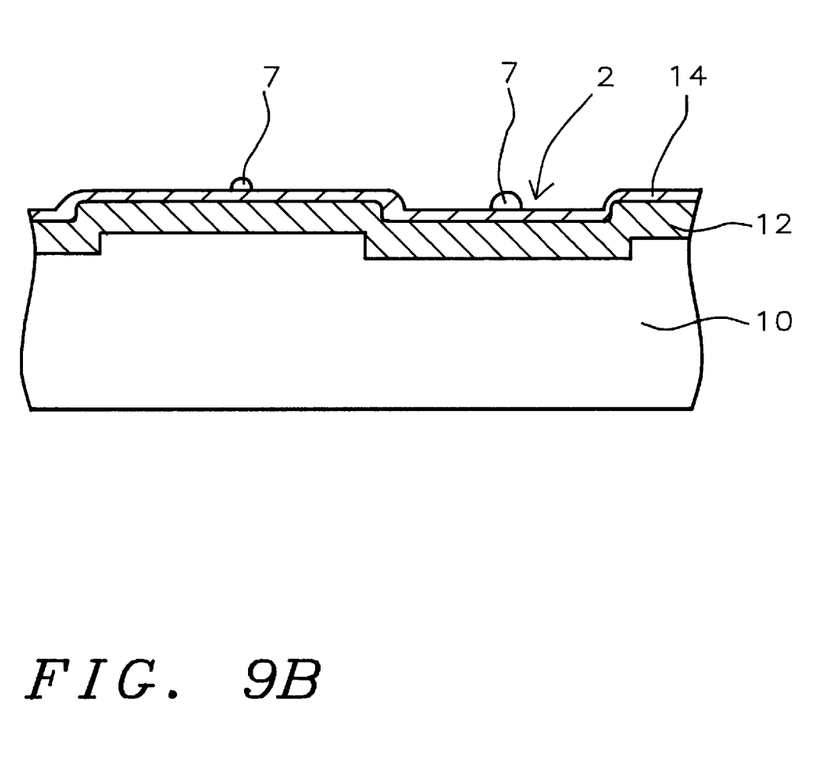

Referring now more specifically to FIGS. 9A and 9B, the method of this invention is now described for forming the tungsten plugs 14' shown in FIG. 9A, while preserving the recessed area 2 (alignment mark) shown in FIG. 9B. The method involves an etching back of the W layer 14 to the surface of the barrier layer 12 without over-etching. Preferably the etching is an isotropic plasma etching that removes most of the W in the kerf area (FIG. 9B) while forming the W plug 14' having an essentially coplanar surface with the top surface of the Ti/TiN layer 12, as shown in FIG. 9A. Preferably the W layer 14 is etched back using a plasma-enhanced etcher and an etchant gas mixture such as sulfur hexafluoride ($SF_6$). However, without overetching, the rough W surface during etch-back results in residual W particles 7 over the W plug 14', and results in W particles 7 causing a rough surface over the barrier layer 12, which can cause defects that adversely affect the product yield.

Figure 10A:
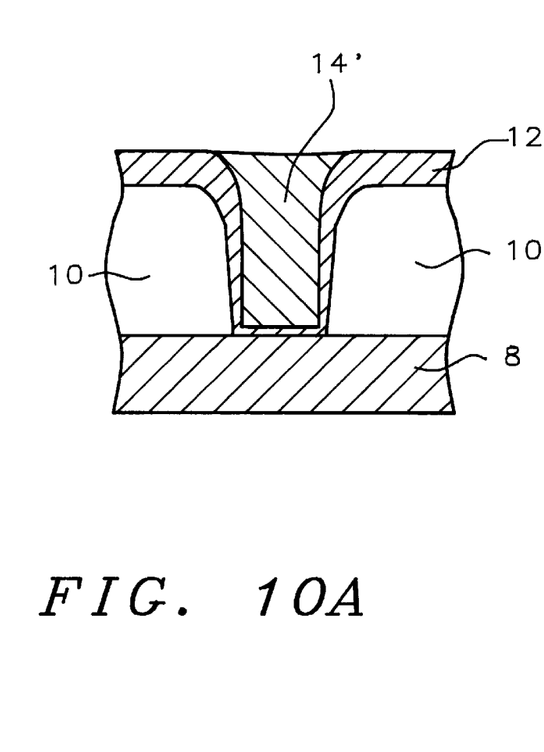
Figure 10B:
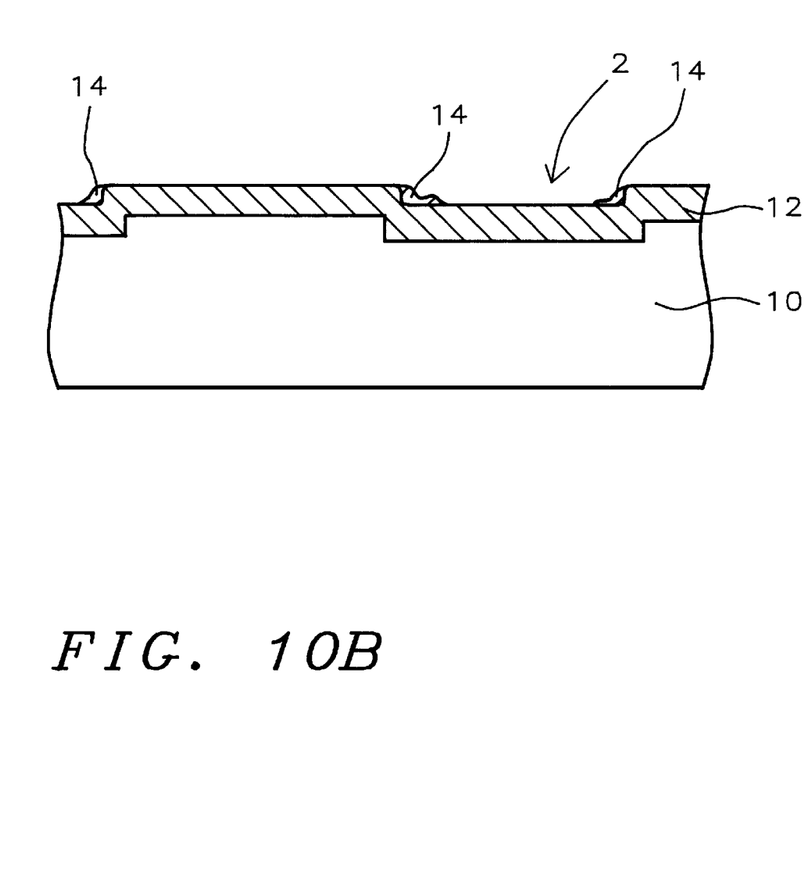

Referring now to FIG. 10A, the method of this invention is further carried out by performing a short chem/mech polishing immediately after the etch-back to remove the tungsten particles 7 remaining on the tungsten plug 14' and on the barrier layer 12. This reduces the surface roughness on layer 12 without significantly recessing the plug 14'. The chem/mech polishing also removes any residual W layer 14 left on the surface of layer 12 after etch-back. The TiN of layer 12 serves as an excellent etch-stop layer for the chem/mech polishing. The chem/mech polishing is carried out in a polishing tool using a polishing slurry, typically for a time of between about 10 and 100 seconds. This eliminates the need for excessively overetching that would otherwise result in undesirable recessing of the W plug 14' that is commonly carried out in the prior art to remove the residual W particles 7, as depicted in FIG. 7. Concurrently the chem/mech polishing over the kerf areas, as shown in FIG. 10B, also removes the residual W without destroying the alignment mark 2, leaving only a slight amount of tungsten 14 along the edges of the recesses 2.

Figure 11A:
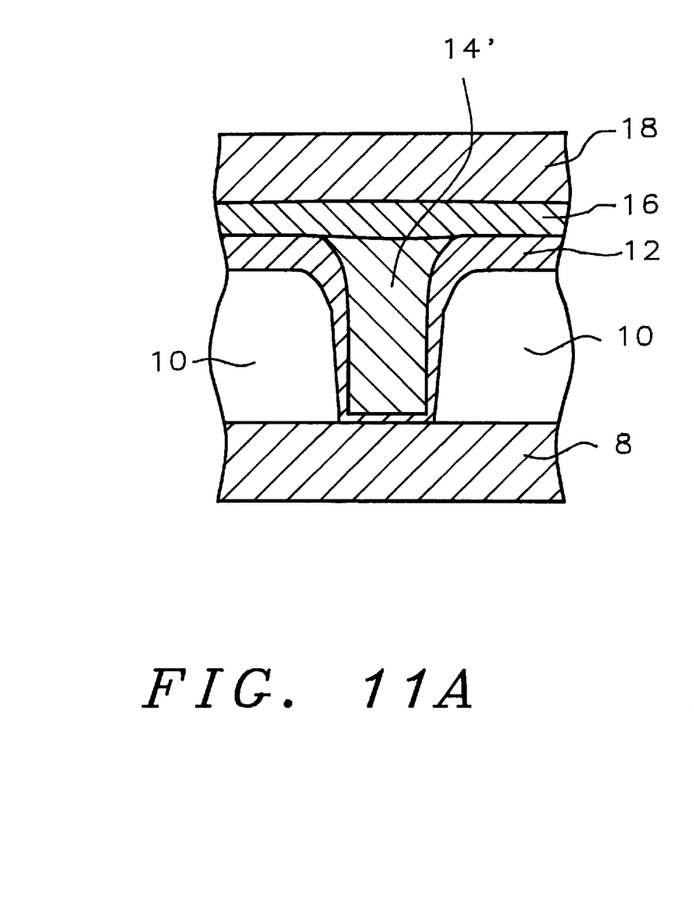
Figure 11B:
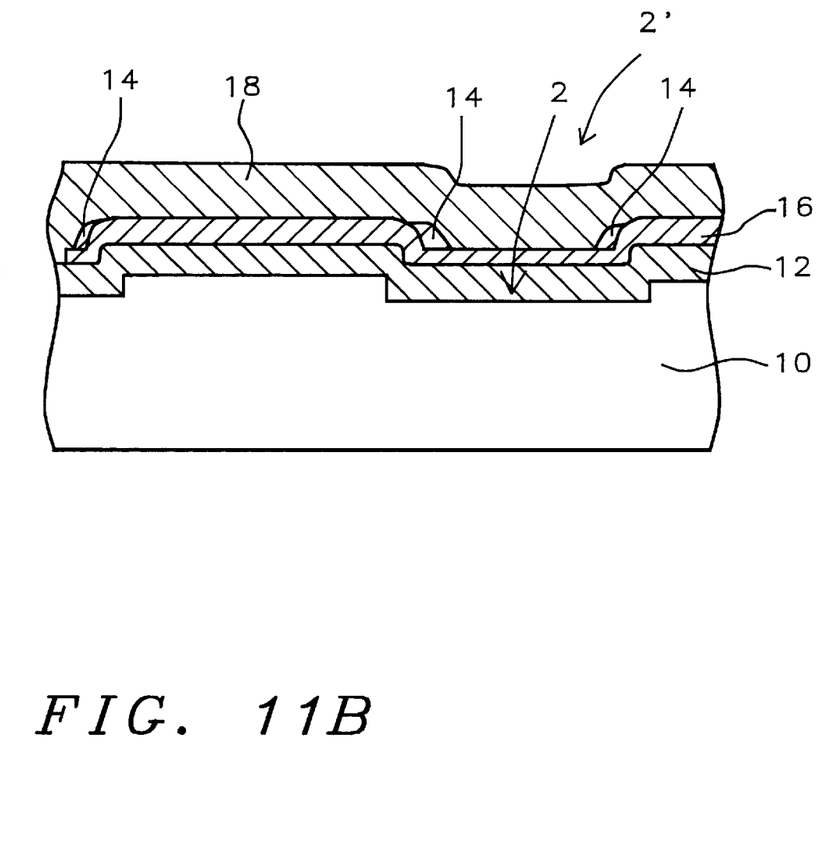

Referring to FIG. 11A, the method for completing the plug via hole structure to the next level of metal (M2) is achieved by depositing a conformal second barrier layer 16 over the W plugs 141 and over the first barrier layer 12. As shown in FIG. 11B, layer 16 also conformally coats the recessed area 2 in the insulating layer 10. Layer 16 is composed of a Ti/TiN layer and is deposited by the same method used in depositing the first barrier layer 12. Preferably the Ti is deposited to a thickness of between about 0 and 1000 Angstroms, and the TiN is deposited to a thickness of between about 0 and 2000 Angstroms. Still referring to FIG. 11A, a conformal second conducting layer 18, preferably composed of AlCu, is deposited by physical vapor deposition, such as by sputter deposition. Layer 18 is deposited to a preferred thickness of between about 2000 and 8000 Angstroms.

Referring to FIG. 11B, the second conductive layer 18 also conformally coats the recessed area 2 used as the alignment mark, thereby forming a second recessed area 2' in the top surface of the second conductive layer 18 aligned over recessed area 2. This allows for the accurate alignment of a photoresist mask for patterning layer 18 to form the next level of metal interconnections. Aluminium copper alloy layer 18 is then patterned by conventional photolithographic means and plasma etching to form the second level (M2) of interconnections. The method does not require additional masking steps to expose the alignment mark since the recessed area for the alignment mark is retained and is replicated in the conformal second metal (M2).

Figure 12A:
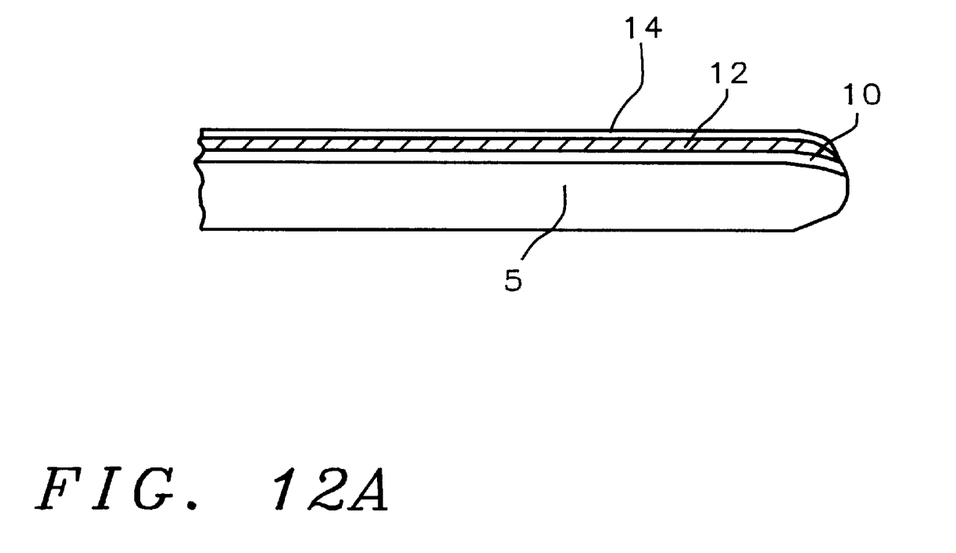
FIGS. 12A and 12B are schematic cross-sectional views through a substrate (wafer) showing, respectively, the wafer as deposited with tungsten on the beveled edge, and after etch-back, by the method of this invention, without the tungsten residue on the beveled edge.
Figure 12B:
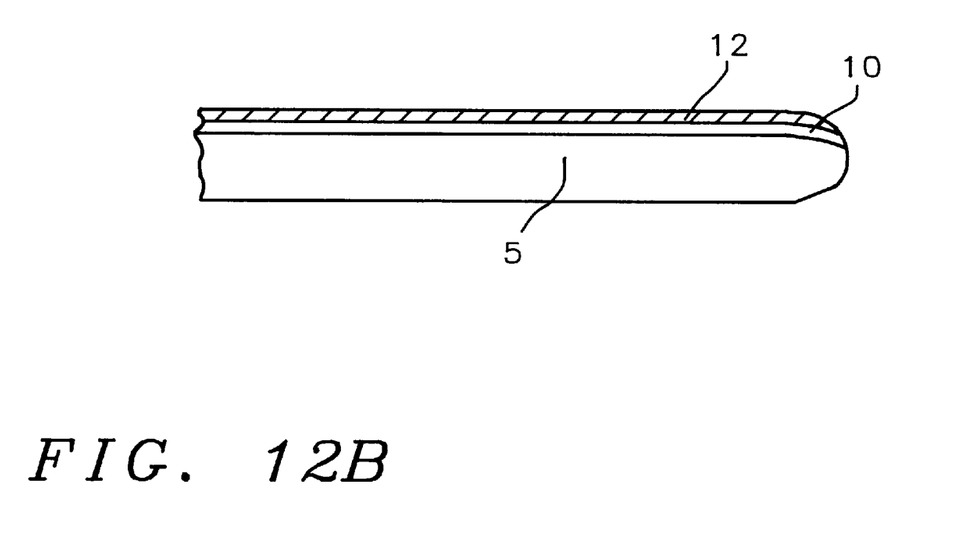

Referring to FIGS. 12A and 12B, the method also eliminates the peeling of tungsten 14 at the beveled edges of the substrate 5 that typically occurs with a CMP process. FIG. 12A depicts the substrate 5 prior to the etch-back and short chem/mech polishing, having on the surface the insulating layer 10, the first barrier layer 12, and tungsten layer 14. After etch-back and chem/mech polishing, FIG. 12B depicts the beveled edge of the substrate without the peeling of tungsten layer 14. This also provides improved product yield.

The process steps for the method of this invention can be repeated to form additional levels of inter-connections to complete the wiring on ULSI circuits.

While the invention has been particularly shown and described with reference to the preferred embodiment thereof, it will be understood by those skilled in the art that various changes in form and detail may be made without departing from the spirit and scope of the invention.

What is claimed is:

1. A method for making metal plugs for electrical interconnections through an opening in an insulating layer between patterned conducting layers while retaining alignment marks comprising the steps of:

(a) providing a semiconductor substrate having semiconductor devices;
    (b) depositing a first conducting layer on said substrate;
    (c) patterning said first conducting layer;
    (d) depositing an insulating layer on said patterned first conducting layer;
    (e) forming openings in said insulating layer to said patterned first conducting layer, said insulating layer having recessed areas used as said alignment marks in kerf areas on said substrate;
    (f) depositing a conformal first barrier layer on said insulating layer and in said openings;
    (g) depositing a conformal metal layer over said barrier layer and thereby filling said openings while said metal remains conformal over said alignment marks in said kerf areas, said alignment marks being significantly wider than said openings;
    (h) etching back said metal layer to the surface of said insulating layer without overetching to remove said metal in said alignment marks and thereby retaining said alignment marks, while said metal in said openings is essentially planar with said insulating layer;
    (i) chemical/mechanically polishing said metal layer to said first barrier layer to remove any residue of said metal remaining after said etch-back thereby forming a smooth surface having said openings filled with said metal plugs;
    (j) depositing a conformal second barrier layer;
    (k) depositing a conformal second conducting layer;
    (l) patterning said second conducting layer and said second and first barrier layers using a photoresist mask aligned to said alignment marks, and anisotropically plasma etching, thereby completing said metal plugs through said insulating layer between said first and second conducting layers.

2. The method of claim 1, wherein both said first and second barrier layers are composed of a titanium layer and a titanium nitride layer, and said titanium layer is between about 0 and 1000 Angstroms thick, and said titanium nitride layer is between about 0 and 2000 Angstroms thick.

3. The method of claim 1, wherein said conformal metal layer is tungsten having a thickness that is at least greater than one-half the maximum width of said openings and substantially less than one-half the width of said recessed areas for said alignment marks.

4. The method of claim 1, wherein said first and second conducting layers are composed of aluminum/ copper alloy.

5. The method of claim 1, wherein the process steps (d) through (l) can be repeated to form additional levels of multilevel interconnects with stacked via holes having said metal plugs, while retaining said alignment marks in said kerf areas.

6. The method of claim 1, wherein said etch-back of said metal layer to said first barrier layer effectively removes residues of said metal on the beveled edge of said substrate.

7. A method for making metal plugs for electrical interconnections through an opening in an insulating layer between patterned conducting layers while retaining alignment marks comprising the steps of:

(a) providing a semiconductor substrate having semiconductor devices;
    (b) depositing a first conducting layer composed of aluminum/copper (AlCu) alloy on said substrate;
    (c) patterning said aluminum/copper alloy first conducting layer;
    (d) depositing an insulating layer on said patterned first conducting layer;
    (e) forming openings thereby forming via holes in said insulating layer to said patterned first conducting layer, said insulating layer having recessed areas used as said alignment marks in kerf areas on said substrate;
    (f) depositing a conformal first barrier layer composed of a titanium (Ti) layer and a titanium nitride (TiN) layer on said insulating layer and in said openings;
    (g) depositing a conformal tungsten (W) metal layer over said barrier layer and thereby filling said openings while said tungsten metal remains conformal over said alignment marks in said kerf areas, said alignment marks being significantly wider than said openings;
    (h) etching back said tungsten metal layer to the surface of said insulating layer without overetching to remove said tungsten metal in said alignment marks and thereby retaining said alignment marks, while said tungsten metal in said openings is essentially planar with said insulating layer;

(i) chemical/mechanically polishing said remaining tungsten metal layer on said first barrier layer to remove any tungsten metal residue tungsten metal remaining after said etch-back thereby forming a smooth surface having said openings filled with said tungsten metal plugs;

(j) depositing a conformal second barrier layer composed of a titanium layer and titanium nitride layer;

(k) depositing a conformal second conducting layer composed of aluminium/copper (AlCu) alloy;

(l) patterning said second conducting layer and said Ti/TiN second and first barrier layers using a photoresist mask aligned to said alignment marks, and anisotropically plasma etching, thereby completing said tungsten metal plugs through said insulating layer between said AlCu first and second conducting layers.

8. The method of claim 7, wherein said titanium layer has a thickness of between about 0 and 1000 Angstroms, and said titanium nitride layer has a thickness of between about 0 and 2000 Angstroms.

9. The method of claim 7, wherein said conformal tungsten metal layer has a thickness that is at least greater than one-half the maximum width of said openings and less than one-half the width of said alignment marks.

10. The method of claim 7, wherein the process steps (d) through (l) can be repeated to form additional levels of multilevel interconnects with stacked via holes having said tungsten (W) metal plugs, while retaining said alignment marks in said kerf areas.

11. The method of claim 7, wherein said etch-back of said tungsten metal layer to said first barrier layer effectively removes residues of said tungsten metal on the beveled edge of said substrate.

12. A method for making metal plugs in contact openings for electrical connections to semiconductor devices while retaining alignment marks comprising the steps of:

(a) providing a semiconductor substrate having semiconductor devices;

(b) depositing a first conducting layer on said substrate composed of an electrically conductively doped polysilicon;

(c) patterning said first conducting layer, and forming portions of said semiconductor devices;

(d) depositing an insulating layer on said patterned first conducting layer;

(e) forming openings in said insulating layer to said patterned first conducting layer, thereby forming contact openings to said devices, and further said insulating layer having recessed areas used as said alignment marks in kerf areas on said substrate;

(f) depositing a conformal first barrier layer on said insulating layer and in said contact openings;

(g) depositing a conformal tungsten (W) metal layer over said barrier layer and thereby filling said contact openings while said tungsten metal remains conformal over said alignment marks in said kerf areas, said alignment marks being significantly wider than said openings;

(h) etching back said metal layer to the surface of said insulating layer without overetching to remove said metal in said alignment marks and thereby retaining said alignment marks, while said metal in said contact openings is essentially planar with said insulating layer;

(i) chemical/mechanically polishing said tungsten metal layer to said first barrier layer to remove any residue of said tungsten metal remaining after said etch-back thereby forming a smooth surface having said openings filled with said tungsten metal plugs;

(j) depositing a conformal second barrier layer;

(k) depositing a conformal second conducting layer;

(l) patterning said second conducting layer and said second and first barrier layers using a photoresist mask aligned to said alignment marks, and anisotropically plasma etching, thereby completing said tungsten plugs in said contact openings in said insulating layer between said second conducting layer and said first conducting layer that forms portions of said devices.

13. The method of claim 12, wherein both said first and second barrier layers are composed of a titanium layer and a titanium nitride layer, and said titanium layer is between about 0 and 1000 Angstroms thick, and said titanium nitride layer is between about 0 and 2000 Angstroms thick.

14. The method of claim 12, wherein said conformal tungsten metal layer has a thickness that is at least greater than one-half the maximum width of said contact openings and substantially less than one-half the width of said recessed areas for said alignment marks.

15. The method of claim 12, wherein said first conducting layer composed of said conductively doped polysilicon is deposited to a thickness of between about 1000 and 4000 Angstroms.

16. The method of claim 12, wherein said second conducting layers composed of aluminum/copper alloy is deposited to a thickness of between about 2000 and 8000 Angstroms.

17. The method of claim 12, wherein said etch-back of said metal layer to said first barrier layer effectively removes residues of said metal on the beveled edge of said substrate.

* * * * *